United States Patent [19]
Obori et al.

[11] Patent Number: 5,596,195
[45] Date of Patent: Jan. 21, 1997

[54] METHOD AND APPARATUS FOR MEASURING THE DISTRIBUTION OF ELEMENTS CONTAINED IN SAMPLE

[75] Inventors: Kenichi Obori; Atsushi Bando; Toshikazu Yurugi, all of Miyanohigashi-machi, Japan

[73] Assignee: Horiba, Ltd., Kyoto, Japan

[21] Appl. No.: 529,288

[22] Filed: Sep. 15, 1995

[30] Foreign Application Priority Data

Sep. 16, 1994 [JP] Japan .................................. 6-248845

[51] Int. Cl.⁶ .................................................. H01J 37/00
[52] U.S. Cl. ............................................ 250/310; 250/305
[58] Field of Search .................................. 250/310, 305, 250/306, 307, 309, 397, 398; 378/87, 86, 88

[56] References Cited

U.S. PATENT DOCUMENTS

| | | | |
|---|---|---|---|
| 4,857,731 | 8/1989 | Tagwa | 250/310 |
| 5,065,020 | 11/1991 | Kanda | 250/310 |

Primary Examiner—Jack I. Berman
Assistant Examiner—Kiet T. Nguyen
Attorney, Agent, or Firm—Price, Gess & Ubell

[57] ABSTRACT

An apparatus and method of identifying substances contained in a sample to both identify the elements in the sample and to measure a distribution of the elements are provided. The sample is scanned with electron beams to form X-ray images of two or elements. These X-ray images can be used to form a scattering diagram, and the composition of known materials can be plotted on the scattering diagram. The substances contained in the samples can be identified, and the distribution of the substances can be obtained by comparing the data on the scattering diagram with the plot.

8 Claims, 5 Drawing Sheets

METHOD AND APPARATUS FOR MEASURING THE DISTRIBUTION OF ELEMENTS CONTAINED IN SAMPLE

BACKGROUND OF THE INVENTION

1. Field of the Invention

The present invention relates to a method and apparatus of identifying substances contained in a sample and the distribution of the substances contained in the sample by the use of X-ray microanalysis for analyzing characteristic X-rays generated when electron beams or X-rays are incident upon the substances.

2. Description of Related Art

Figure 7:
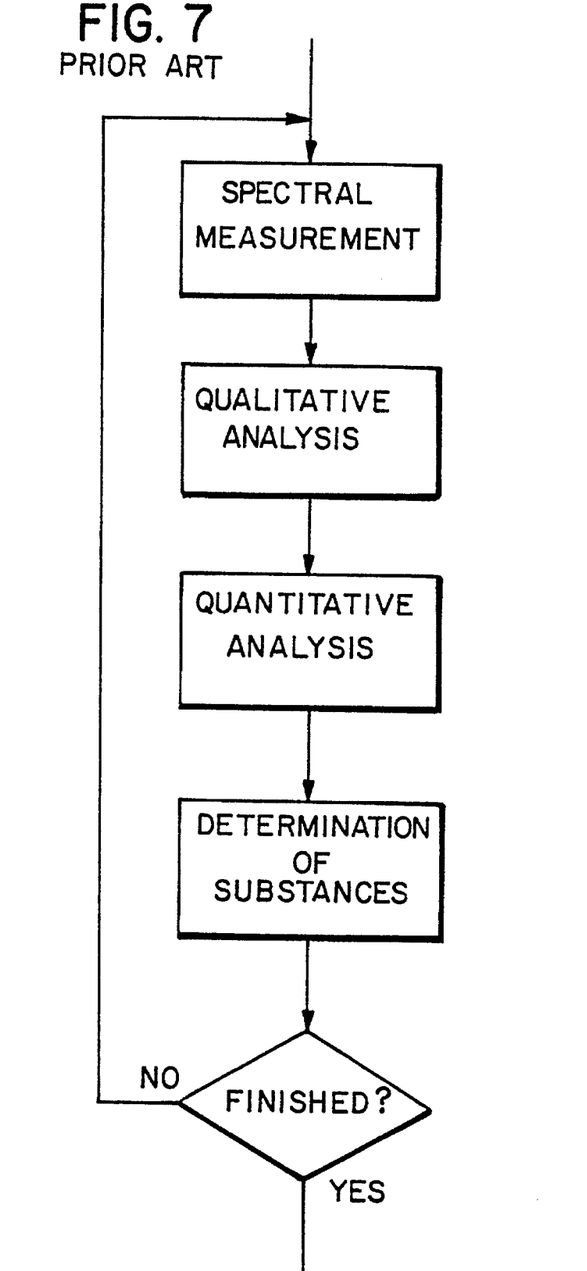
FIG. 7 is a diagram for describing a conventional method.

In the case where a sample, constructed from a plurality of unknown substances, is analyzed by the use of an X-ray microanalyzer, electron beams are directed to impact upon individual substances. The resultant X-ray spectrum is then analyzed to determine the concentrations of elements contained in the sample. For example, in the case where a rock sample is analyzed, as shown in FIG. 7, a spectral measurement is conducted for each of the constituent materials to determine concentrations of contained elements by a qualitative analysis procedure, and also a quantitative analysis procedure, to thereby estimate a mineral corresponding to that composition.

However, in the above-described conventional methods, a disadvantage has occurred in that the time period required for an analysis is increased with an increase in the number of the substances contained in the sample. In addition, a problem has occurred in that considerable knowledge and time are required for the operation of identifying a pertinent name of the material from compositions of individual substances.

Accordingly, the prior art is still seeking to improve the apparatus and procedure of identifying unknown elements in a sample.

OBJECTS AND SUMMARY OF THE INVENTION

The present invention provides a novel and useful apparatus and method of identifying substances contained in a sample by directly identifying constituent substances of the sample and also a method of measuring a distribution of the substances contained in the sample without separately conducting an analysis of spectra.

The intensity of characteristic X-rays generated when electron beams or X-rays are incident upon the sample with scanning is memorized in a memory for every element, and a characteristic X-ray image for every element is then formed on the basis of the memorized intensity of characteristic X-rays across the scan length. Subsequently, two or more images are formed by multiplying the characteristic X-ray image by a suitable coefficient by means of an operating device such as a computer system. A scattering diagram showing a correlation among these images is drawn by means of the operating device to be displayed on a display. A coordinate on the scattering diagram of preliminarily stored characteristics of the material is calculated on the basis of a known X-ray spectrum of the material. The resulting coordinate is plotted on the scattering diagram, and data on the scattering diagram is compared with the plot. In the case where the data coincides with the plot, it can be estimated that a preliminarily registered composition of the material is contained in the sample.

In the method of measuring a distribution of the substances contained in the sample according to the present invention, an intensity of characteristic X-rays is generated when electron beams or X-rays are incident upon the sample during scanning. The intensity is memorized in a memory for every element, and a characteristic X-ray image for every element is formed on the basis of the memorized intensity of the characteristic X-rays. Subsequently, two or more operated images are formed by multiplying the characteristic X-ray image by a suitable coefficient by means of an operating device. A scattering diagram, showing a correlation among these operated images, is drawn by means of the operating device to be displayed on a display. A coordinate on the scattering diagram of a preliminarily registered amount of the material being calculated on the basis of a known X-ray spectrum of the material is plotted on the scattering diagram. Data on the scattering diagram is compared with the plot. In the case where the data coincides with the plot, it can be estimated that the preliminarily registered amount of the material is contained in the sample. A spectral intensity of the composition of the material, of which existence has been predetermined, can be compared with the characteristic X-ray image for every element to display a portion where the pertinent composition of the material exists.

In the above-described methods, in place of an incidence of the electron beams or the X-rays upon the sample followed by detecting the characteristic X-ray generated at that time, the electron beams may be incident upon the sample to produce secondary electrons generated at that time (Auger electron spectroscopy), or ions may be incident upon the sample to detect the characteristic X-rays generated at that time (particle radiation-excited X-ray spectroscopy), or ions may be incident upon the sample to detect the secondary ions generated at that time (secondary ion mass analysis).

According to the present invention, even though a large number of the same chemical composition of the material exist at different positions of the sample, they are shown at one place on the scattering diagram. Thus, it is possible to judge whether or not the pertinent quality of the material exists in the sample by comparing the data on the scattering diagram with the plot. Conventionally, it has been necessary to conduct a judgment for every individual position. Thus, extra time has been required.

Although at first the composition of elements must be determined and then the pertinent chemical composition of the material must be estimated on the basis of independent information in the conventional methods, according to the present invention, not only are these intermediate processes not required, but also extra time and technical knowledge are not required. In addition, according to the present invention, the identification and the measurement of the distribution of the substances contained in the sample can be conducted at the same time.

Moreover, according to the present invention, the scattering diagram is drawn by the use of an operated image formed by multiplying the characteristic X-ray image by a suitable coefficient. In addition, it is not required to select the characteristic X-ray image of the element regarded as being related to the substance contained in the sample and then draw a scattering diagram by the use of it. Thus, time and technical knowledge are not required.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings.

DETAILED DESCRIPTION OF THE PREFERRED EMBODIMENTS

The following description is provided to enable any person skilled in the art to make and use the invention and sets forth the best modes contemplated by the inventors of carrying out their invention. Various modifications, however, will remain readily apparent to those skilled in the art, since the generic principles of the present invention have been defined herein specifically to provide an improved method and apparatus for measuring distribution of elements in a sample.

Figure 1:
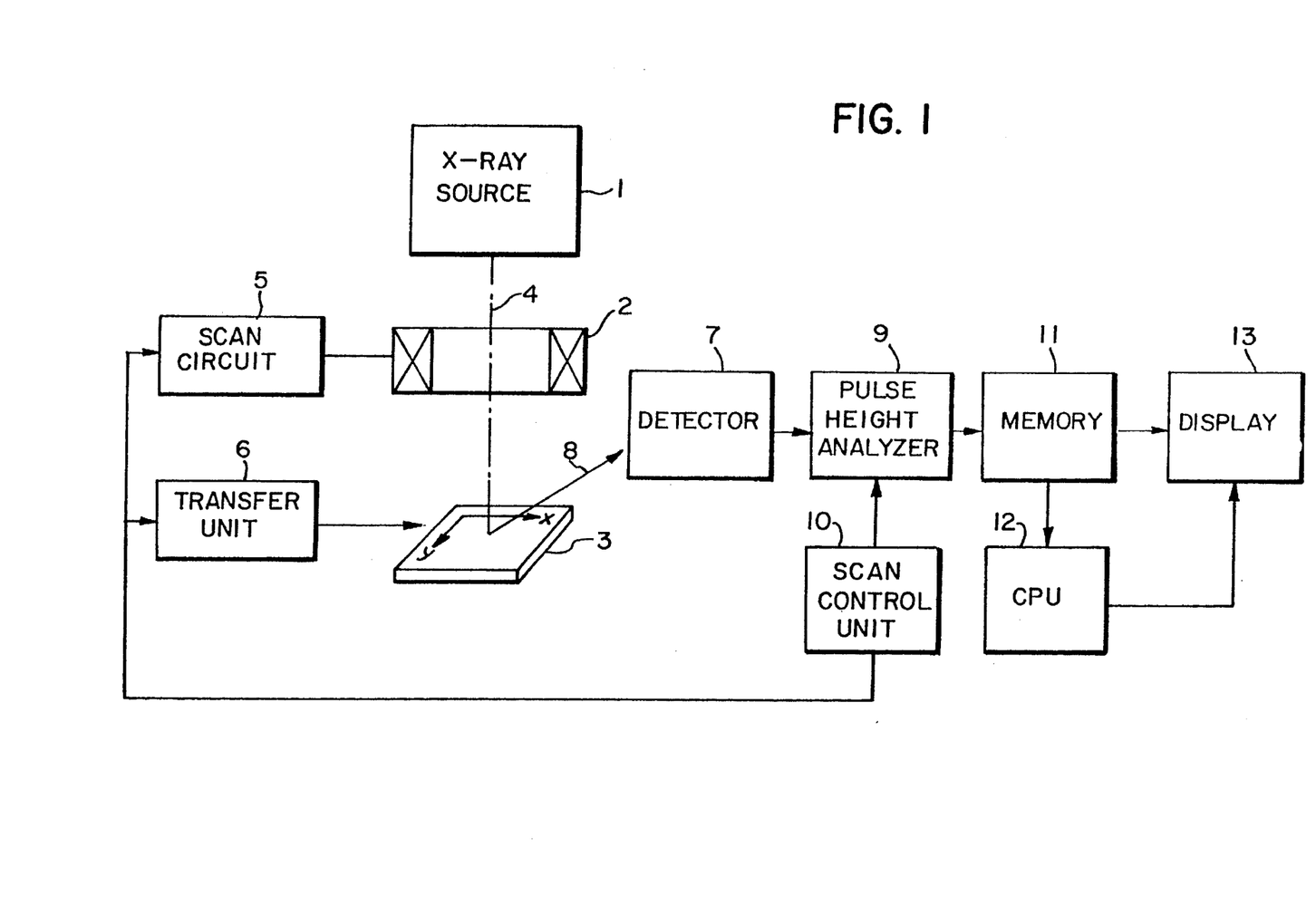
FIG. 1 is a schematic diagram showing one example of an apparatus used in a method of the present invention.

One example of an X-ray microanalyzer that can be used according to the present invention will be described with reference to FIG. 1. Referring to FIG. 1, reference numeral 1 designates an electron gun provided in an upper portion of a sample chamber (not shown), and reference numeral 2 designates an electron beam-scanning coil for scanning electron beams 4 emitted toward a sample 3 which is arranged in a lower portion of the inside of the sample chamber. The electron gun 1 can scan in two-dimensional directions (x-direction and y-direction meeting at right angles with each other). Reference numeral 5 designates an electron beam-scanning circuit for controlling the electron beam-scanning coil 2. Reference numeral 6 designates a sample-transferring unit for transferring or moving a sample stage (not shown), on which the sample 3 is carried, in both an x-direction and a y-direction.

Reference numeral 7 designates an X-ray detector for detecting characteristic X-rays 8 emitted from the sample 3 when the electron beams 4 are incident upon the sample 3. Reference numeral 9 designates a pulse height analyzer for calculating the number of characteristic X-rays for every individual element on the basis of signals from the X-ray detector 7. Reference numeral 10 designates a scan-controlling unit controlling the electron beam-scanning circuit 5, the sample-transferring unit 6, and the pulse height analyzer 9, respectively, to provide a readout of X-rays across the specific scan path of the sample. In addition, reference numeral 11 designates an image memory, reference numeral 12 designates an operating device such as a computer system, and reference numeral 13 designates a display.

The image memory 11, such as a RAM, can store the output of the pulse-height analyzer 9 along with coordinate data identifying the specific location of the impact point of the radiation on the sample. This coordinate data is related to the positioning signals for the sample-transferring unit 6, which can be a microtransducer unit, as known in the semiconductor industry. The operating device 12 can be a computer-based system for processing the stored information in the image memory 11. The operating device 12 can further store predetermined information such as the characteristic X-ray pattern for a known chemical position, for example, in a RAM or ROM, and operate upon that information with a control software program for making a comparison and for driving a display to produce images on a display 13, such as graphic information represented by FIG. 4.

A method of identifying substances contained in the sample and a method of measuring the distribution of the substances contained in the sample according to the present invention using the X-ray microanalyzer having the above-described construction will be described with reference also to FIGS. 2–6. Now, it is assumed that four elements are contained in the sample 3.

When appropriate electron beams 4 are incident upon the sample 3, characteristic X-rays 8 are emitted from the sample 3. At this time, the path of the electron beams 4 or the sample 3 is transferred in the x- and y-directions by a controlling signal from the scan-controlling unit 10 to make the electron beams 4 incident upon the sample 3 at discrete locations during scanning.

Characteristic X-rays 8 are emitted from the sample 3 and are detected by means of the X-ray detector 7, and the number of the characteristic X-rays 8 for every individual element is counted in the pulse height analyzer 9.

Four characteristic X-ray images 14-1, 14-2, 14-3, and 14-4 corresponding to four elements, respectively, are obtained, as shown in FIGS. 2a, 2b, 2c, and 2d, by storing the calculated values in the image memory 11 having addresses corresponding to the scanning coordinates (x, y) of a position of the electron beams 4 or the sample 3 and the kinds of the elements. In these characteristic X-ray images 14-1 to 14-4, shades of gray show degrees of distribution of the elements.

Figure 2A:
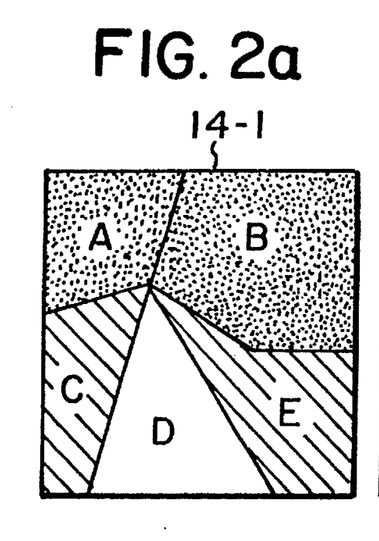
FIGS. 2a, 2b, 2c, and 2d are diagrams showing examples of a characteristic X-ray image.
Figure 2B:
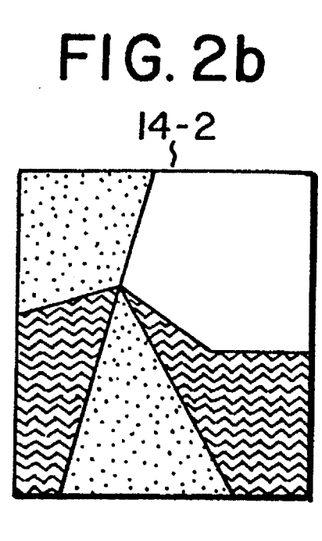
Figure 2C:
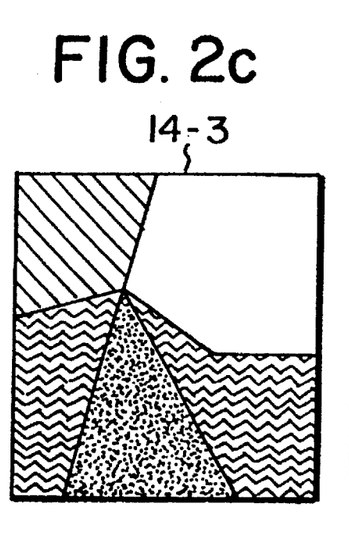
Figure 2D:
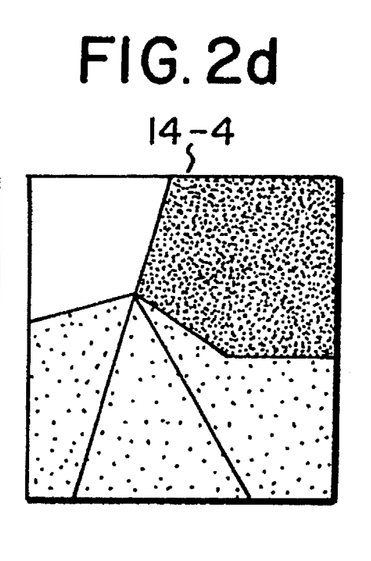

In FIG. 2a, the square 14-1 is divided into five ranges, designated A through E for purposes of illustration. This provides an estimation of the ranges measured on the sample based on the two-dimensional matrix of information memorized in the memory 11 from the characteristic X-rays counted during the scan. These substances are different in chemical components, respectively, and the X-ray spectra generated when the incident beams are incident upon them are different for every range. Referring to FIGS. 2a to 2d, the respective portions are hatched or shaded to show that the characteristic X-ray value calculated is different in dependence upon the range.

In addition, referring to 14-1, which represents one of the four elements, the range A is the same as the range B, and the range C is the same as the range E in intensity of the characteristic X-rays, but, referring to the images for other elements, the range A is different from the range B in intensity of the characteristic X-rays (pattern), so that the range A is different from the range B in kind of the substance contained. The range C is the same as the range E in intensity of the characteristic X-rays for all elements, so that the range C is the same as the range E in substance contained.

Figure 3A:
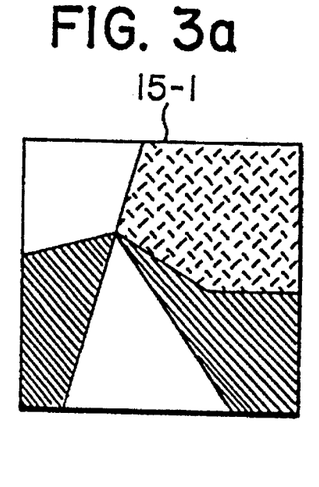
FIGS. 3a and 3b are diagrams showing examples of an image obtained by processing the characteristic X-ray image.
Figure 3B:
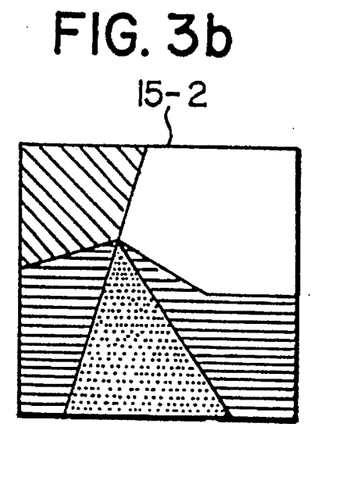

Subsequently, one operated image 15-1, as shown on FIG. 3a, is formed by multiplying the characteristic X-ray images 14-1, 14-2, 14-3, and 14-4 obtained by the above-described manner by coefficients of suitable combination, respectively, followed by adding the products. Another operated image 15-2, as shown on FIG. 3b, is formed by multiplying the characteristic X-ray images 14-1, 14-2, 14-3, and 14-4, by coefficients of combination different from the above-described combination, respectively, followed by adding the products. The coefficients used for these operations are calculated in the operating device 12 from the original characteristic X-ray images 14-1 to 14-4 by a multivariable statistic analytical method such as Principal Component Analysis.

15-1 and 15-2 of FIGS. 3a and 3b are obtained by a linear combination of the characteristic X-ray images 14-1, 14-2, 14-3, and 14-4.

$$P_1(x,y)=A_{11}I_1(x,y)+A_{12}I_2(x,y)+A_{13}I_3(x,y)+A_{14}I_4(x,y) \quad (1)$$

$$P_2(x,y)=A_{21}I_1(x,y)+A_{22}I_2(x,y)+A_{23}I_3(x,y)+A_{24}I_4(x,y) \quad (2)$$

Herein, $I_i(x,y)$ represents the intensity of the characteristic X-rays of the element i at the coordinate (x,y).

The substance in the sample is discriminated on the basis of the difference between $P_1(x,y)$ and $P_2(x,y)$. Thus, it is desirable to select a coefficient $A_{ij}$ so that the difference between $P_1(x,y)$ and $P_2(x,y)$ may be increased as far as possible and they may not correlate with each other.

To this end, the coefficients are calculated by the Principal Component Analysis Method. The following Covariance matrix D is calculated to obtain the Eigenvalue $\lambda_1$, and the Eigenvector ai of the matrix D.

In this case, n combinations of $\lambda_1$ and ai equal to the number n of elements are obtained by the linear mathematical theorem. The largest and the next Eigenvalues and Eigenvectors are selected from them to be used as $\lambda_1$, a1, and $\lambda_2$, a2.

$$D = \begin{pmatrix} d11 & d12 & \Lambda & \Lambda & d1n \\ d21 & 0 & & & \\ M & & dij & & \\ M & & & 0 & \\ dn1 & & & & dnn \end{pmatrix}$$

$$dij = \Sigma_{x,y}(Ii(x,y) - \bar{I}i) \cdot (Ij(x,y) - \bar{I}_j)$$

$$Dai = \lambda i \cdot ai$$

$$i,j = 1 \Lambda n$$

The respective components of the vectors a1, a2 are used as the coefficients $A_{11}$ and $A_{21}$ (i=1 ... n) in Equations (1) and (2).

The operating device 12 can draw a scattering diagram 16-1 (refer to FIG. 4) showing a correlation between the two operated images 15-1, 15-2. In short, values at the same place on the operated image 15-1 and the operated image 15-2 are read to add the numerical value of 1 to pertinent coordinates of the scattering diagram 16-1 with the value of the operated image 15-1 as an axis of ordinate and the value of the operated image 15-2 as an axis of abscissa. Successively, this operation is conducted all over the surface of operated images to form four islands 17-1, 17-2, 17-3, and 17-4 which increase in numerical value within the scattering diagram 16-1. A number of these islands 17-1 to 17-4 correspond to the material composition contained in the sample. The total of the numerical values for the individual islands shows an area of the corresponding material composition.

Figure 4:
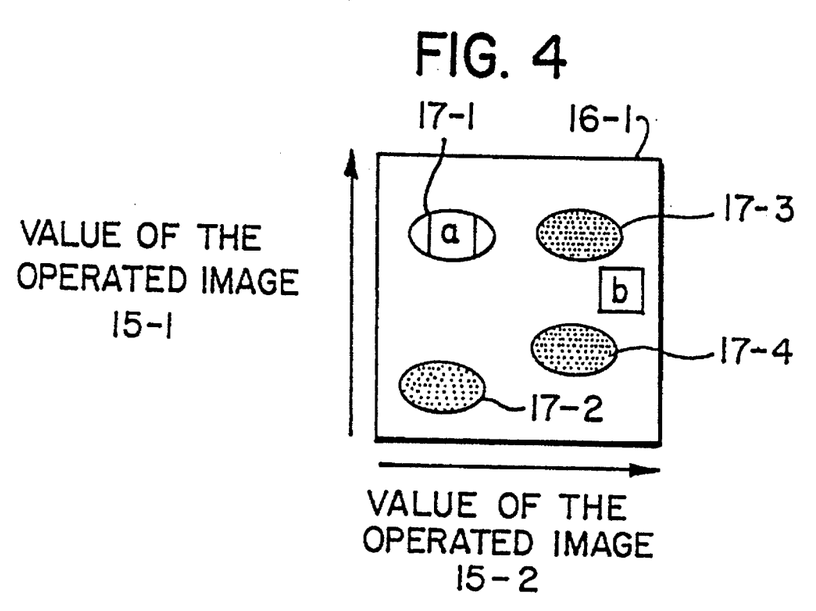
FIG. 4 is a drawing showing one example of a scattering diagram.

The scattering diagram 16-1 can be drawn as follows. It is assumed that $P_1(x,y)$ and $P_2(x,y)$ are drawn on the basis of the above Equations (1) and (2). Here, (x,y) is the coordinate, upon which the incident beams are incident, on the sample.

On the assumption that the maximum values and the minimum values of $P_1(x,y)$ and $P_2(x,y)$ are $P_{1max}$, $P_{1min}$ and $P_{2max}$, $P_{2min}$, the sections between these maximum values and the minimum values are divided into the suitable number (K) of step.

$$P_1^0 (=P_{1min}), P_1^1, P_1^2, \ldots P_1^K (=P_{1max})$$

$$P_2^0 (=P_{2min}), P_2^1, P_2^2, \ldots P_2^K (=P_{2max})$$

The scattering diagram 16-1 is a two-dimensional matrix $S(i,j)$ (i,j=1,2 ... K) on the memory, and K is the number of points (x,y) where $S(i,j)=(P_1^{i-1}<P_1(x,y)\leq P_{1i}$ and $S(i,j)=P_2^{j-1}<P_2(x,y)\leq P_2^j$ hold good.

In the example, the sample comprises five ranges A, B, C, D, E (four kinds of substance) (see FIG. 2a) and 15-1 [that is to say, $P_2(x,y)$] of FIGS. 3a and 3b have four-stepped values, respectively. Accordingly, the portion, where S(i, j)>0 holds good, appears at four places (that is to say, 17-1, 17-2, 17-3, and 17-4) on the scattering diagram 16-1. Ideally, S(i,j)>0 holds good merely at four points within the scattering diagram, but the range, where S(i,j)>0 holds good, as shown in FIG. 4, extends elliptically by the statistical fluctuation of the calculated values of the X-rays.

17-1 corresponds to the range of the sample of which $P_1(x,y)$ is relatively large and of which $P_2(x,y)$ is relatively small, while 17-2 corresponds to the range where both $P_1(x,y)$ and $P_2(x,y)$ are small.

Figure 5A:
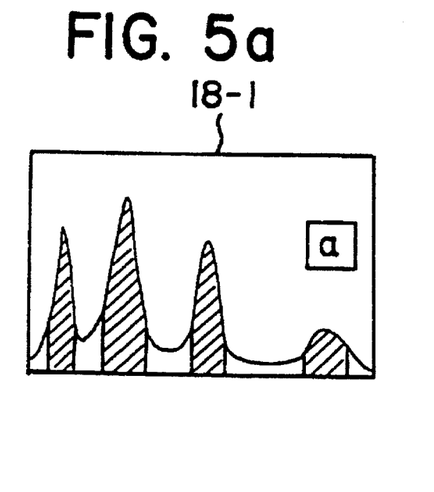
FIGS. 5a and 5b are diagrams showing one example of a standard spectrum for different elements.
Figure 5B:
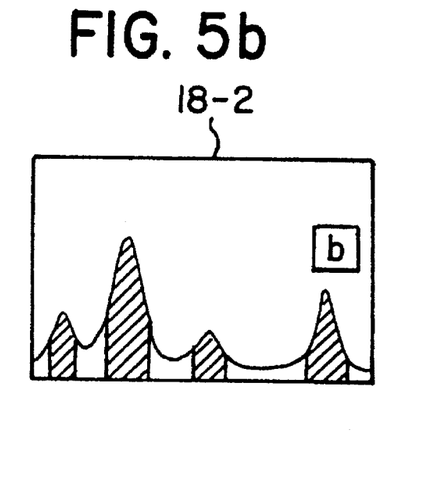

On the other hand, an X-ray spectrum (standard spectrum) of the chemical composition of a material having a possibility of being contained in the sample 3 is previously measured to be recorded in a disk memory and the like. FIGS. 5(a) and 5(b) show one example of standard spectra 18-1, 18-2 of two certain known qualities of the material a, b. An axis of abscissa shows an energy intensity and an axis of ordinate shows a count.

The spectra 18-1, 18-2 shown in FIGS. 5a and 5b are the X-ray spectra obtained by applying electron beams or X-rays to a standard sample of a substance, of which the components have been known, and having the possibility of being contained in the sample. It is assumed that each of four peaks in the above-described figure corresponds to the characteristic X-rays of the element 1, the element 2, the element 3, and the element 4, respectively. The shaded portions in the above-described figure correspond to the counts of the characteristic X-rays for the elements 1 to 4.

On the other hand, 14-1 to 14-4 are the X-ray images of the counts of the characteristic X-rays for the elements 1 to 4 obtained by applying the beams to the unknown sample and recorded as the two-dimensional matrix in the memory 11.

According to the present invention, the distribution of the substance having the same chemical composition as the standard sample within the unknown sample is obtained on the basis of the coincidence of the X-ray images of the unknown sample with the spectrum of the standard sample in intensity of the characteristic X-rays for all elements. Usually, it takes scores of seconds to hundreds of seconds to measure the spectrum, while it takes scores of mseconds to hundreds of mseconds to take in one piece of X-ray image. Since the counted value of the characteristic X-rays is proportional to the measuring time, it is necessary to compensate for the difference in measuring time for the comparison. It is also necessary to compensate for any difference in intensity of the incident electron beams or the incident X-ray beams during the measurements of the standard sample and the unknown sample.

The mark meaning the standard sample (a) is plotted at the coordinate ($P_2^{STDa}$, $P_1^{STDa}$) on the scattering diagram shown in FIG. 4 with the values obtained by applying Equations (1) and (2) to the intensity of the characteristic X-rays obtained from the spectrum of the standard sample (a) as $P_2^{STDa}$, $P_1^{STDa}$. The standard sample (b) is similarly treated. In the case where a certain range of the unknown sample is the same as the standard sample in chemical composition, if the difference of the incident beams in intensity and the difference in measuring time are compensated, the characteristic X-rays will coincide in intensity, and thus the data 17-1, 17-2, . . . on the scattering diagram will coincide with the plot for the standard sample.

In the example shown in FIG. 4, the scattering diagram 16-1 can be displayed on the display of a computer screen and the marks corresponding to the standard samples (a), (b) are also displayed. The operator can easily find that the standard sample (a) coincides with 17-1 and that a substance the same as (a) is contained in the sample. On the other hand, none correspond to (b), so that it can be found that (b) is not contained in the sample.

The operating device 12 determines intensities of the characteristic X-rays of the elements corresponding to the characteristic X-ray images 14-1 to 14-4 from the standard spectra recorded in a memory to conduct the same operation as in the formation of the operated images 15-1, 15-2, thereby determining coordinates on the scattering diagram 16-1. In this case, it is preferable to compensate for differences between the image and the standard spectrum in both measuring time and the electric current applied to provide the electron beams 4.

Display 13 plots suitable marks, for example a, b, at positions corresponding to the coordinates calculated from the standard spectra 18-1, 18-2 on the scattering diagram 16-1, so it can be judged whether or not the islands 17-1 to 17-4 within the scattering diagram 16-1 overlap the marks a, b. In the case where, for example, one island 17-1 overlaps one mark a, it can be judged that the composition of the material a is contained in the sample 3.

Figure 6:
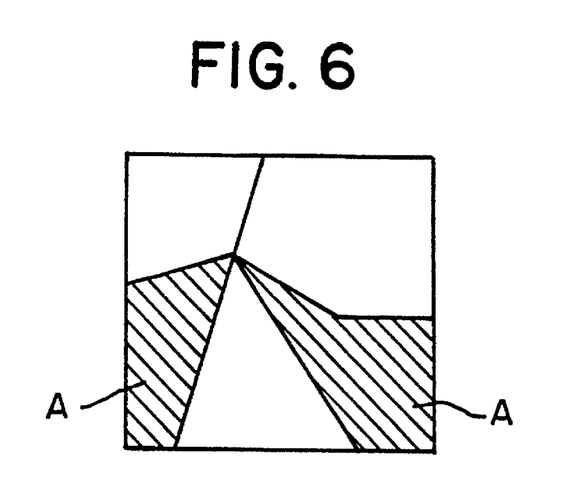
FIG. 6 is a diagram showing a distribution of a material obtained as a result of identification and measurement of distribution.

A portion where the composition of the material A exists (shaded portion) is determined, as shown in FIG. 6, by comparing the spectral intensity of the composition of the material A, which has been judged to exist in the sample 3, with the characteristic X-ray images 14-1 to 14-4 to be displayed on the display.

As above-described, in a method of identifying substances contained in the sample and a method of measuring a distribution of the substances contained in the sample according to the present invention, even though a large number of the same composition of material exist at different positions on the sample 3, they are shown at one place on the scattering diagram 16-1. Thus, in the case where it is judged whether or not the pertinent chemical composition of the material exists in the sample 3 by comparing the data on the scattering diagram 16-1 with the plot, only one judging operation is sufficient for one composition of material. It is also not required to determine the specific composition. In addition, the scattering diagram is drawn by the use of the operated image formed by multiplying the characteristic X-ray image by the suitable coefficients, so that not only is it not required to select the characteristic X-ray image of the element regarded as being related to the substance contained in the sample and draw the scattering diagram by the use of it, but also, it is not required to estimate the composition of the material on the basis of separate information. Thus, the judgment can be conducted in a short time without technical knowledge. The identification and the measurement of the distribution of the material contained in the sample 3 can be conducted at the same time.

Although the electron beams 4 are used as an excitation source of X-rays in the above-described preferred embodiment, X-rays may be used in place of the electron beams 4. In addition, an X-ray spectroscope, an X-ray detector, and a single-channel analyzer may be combined in place of the X-ray detector 7 and the pulse height analyzer 9.

In addition, the present invention is not limited by the case where the electron beams or the X-rays are incident upon the sample 3 followed by detecting the characteristic X-rays 8 generated at that time. Electron beams may also be incident upon the sample 3 to detect secondary electrons generated at that time (Auger electron spectroscopy). In this case, for example, an energy analyzer and a channeltron are used in place of the combination of the X-ray detector 7 and the pulse height analyzer 9 to detect secondary electrons. Also, ions may be incident upon the sample 3 to detect the characteristic X-rays generated at that time (particle-induced X-ray emission). In this case, the X-ray detector 7 and the pulse height analyzer 9 are used to detect the characteristic X-rays. Moreover, ions may be incident upon the sample 3 to detect the secondary ions generated at that time (secondary ion mass spectroscopy). In this case, a mass analyzer is used to detect the secondary ions. In all of these cases, it is sufficient to conduct the image treatment and the operating treatment in accordance with the above-described preferred embodiment.

Furthermore, although two operated images were formed and a scattering diagram showing the correlation of two degrees was drawn by the use of them in the above-described preferred embodiment, three images may be formed to draw the scattering diagram showing the correlation of three degrees, thereby identifying the substances.

As above-described, according to the present invention, the constituent substances of a sample can be directly identified and the distribution can be easily measured without separately conducting an analysis of spectra and the identification of an element.

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. A method of identifying substances contained in a sample wherein an intensity of resultant characteristic X-rays which are generated when radiation such as electron beams or X-rays are incident on a known element are prestored, comprising the steps of:

scanning the sample with radiation;

detecting the resultant intensity of X-rays after an impact of said X-rays with the sample;

determining a characteristic X-ray image from the detected resultant intensity of X-rays and the prestored characteristic X-rays for each element;

obtaining two or more images by multiplying the characteristic X-rays by a predetermined coefficient; and forming, from the images, a composite scattering diagram image to disclose a correlation of the composition of material in the sample.

2. The method of claim 1 further including the step of plotting on the scattering diagram a known composition of material to disclose a composite graphic wherein the overlapping of the known composition of material with the scattering diagram will indicate the presence of the known composition of material in the sample.

3. The method of claim 1 wherein the composite scattering diagram is visually displayed on a screen to enable an operator to determine a coincidence of composition of material in the sample.

4. The method of claim 1 wherein, when the scattering diagram image is generated, the existence of the same composition of material at different positions on the sample is compressed to one location on the scattering diagram.

5. A system for identifying a plurality of unknown substances in a sample comprising:

means for scanning a sample with X-rays;

means for detecting the intensity of X-rays from the resultant impact of the X-rays on the sample;

means for coordinating the impact location with the intensity of X-rays detected;

means for storing a characteristic X-ray intensity with the coordinate location to provide a characteristic X-ray image data;

means for storing a predetermined X-ray characteristic image data for a known material; and means for forming a composite visual display of the characteristic X-ray image data detected with the predetermined X-ray characteristic image data so that any overlapping on the display will indicate the presence of the known material in the sample.

6. The system of claim 5 wherein the means for forming a composite visual display includes a computer system and a video screen.

7. A method of identifying substances contained in a sample, in which an intensity of characteristic X-rays generated when electron beams or X-rays are incident upon said sample with scanning is memorized in a memory for every element, comprising the steps of:

forming a characteristic X-ray image for every element on the basis of predetermined intensities of characteristic X-rays;

subsequently forming two or more images by multiplying said characteristic X-ray image by a suitable coefficient;

forming a scattering diagram showing a correlation among these images on a display;

providing a coordinate on said scattering diagram of a stored composition of material calculated on the basis of a known X-ray spectrum of said stored composition of material, the resulting coordinate being plotted on the scattering diagram; and comparing data on the scattering diagram with said plot, to determine that when the data coincides with the plot then the sample contains the stored composition of material.

8. The method of claim 7 further including the step of comparing a spectral intensity of the stored composition of material with the characteristic X-ray image for every element to display a position on the sample where the composition of material exists.

\* \* \* \* \*